United States Patent [19]

Iyogi et al.

[11] Patent Number: 4,924,033
[45] Date of Patent: May 8, 1990

[54] BRAZING PASTE FOR BONDING METAL AND CERAMIC

[75] Inventors: Kiyoshi Iyogi, Kawasaki; Masako Nakahashi, Tokyo; Hiromitsu Takeda, Tokyo; Makoto Shirokane, Tokyo, all of Japan

[73] Assignee: Kabushiki Kaisha Toshiba, Kawasaki, Japan

[21] Appl. No.: 318,331

[22] Filed: Mar. 3, 1989

[30] Foreign Application Priority Data

Mar. 4, 1988 [JP] Japan .................................. 63-49642

[51] Int. Cl.$^5$ ...................... B23K 35/26; H05K 1/00; H01R 9/00
[52] U.S. Cl. ............................ 174/259; 174/152 GM; 361/405; 29/843; 228/122; 228/248; 228/263.12
[58] Field of Search ............... 228/122, 123, 124, 179, 228/180.1, 180.2, 248, 263.12; 29/842, 843; 174/68.5, 152 GM; 361/405; 403/272

[56] References Cited

U.S. PATENT DOCUMENTS

| 4,409,181 | 10/1983 | Coad . | |
| 4,431,465 | 2/1984 | Mizuhara . | |
| 4,447,392 | 5/1984 | Mizuhara . | |
| 4,611,745 | 9/1986 | Nakahashi et al. | 228/121 |
| 4,672,739 | 6/1987 | Churchwell et al. | 29/843 |
| 4,835,344 | 5/1989 | Iyogi et al. | 228/180.2 |

FOREIGN PATENT DOCUMENTS

| 559434 | 6/1958 | Canada | 228/122 |
| 0164906 | 12/1985 | European Pat. Off. . | |
| 2735638 | 2/1979 | Fed. Rep. of Germany | 228/248 |
| 2188307 | 1/1974 | France . | |
| 163093 | 12/1981 | Japan . | |
| 232692 | 12/1984 | Japan | 228/122 |
| 145972 | 8/1985 | Japan | 228/122 |
| 166165 | 8/1985 | Japan | 228/122 |
| 231474 | 11/1985 | Japan | 228/122 |

OTHER PUBLICATIONS

IBM Technical Disclosure Bulletin, Phelps et al., vol. 24, No. 1B, pp. 859, 860, Jun. 1981.
IBM Technical Disclosure Bulletin, Phelps et al., vol. 24, No. 2, pp. 1212, 1213, Jul. 1981.
IBM Technical Disclosure Bulletin, Ward, vol. 24, No. 6, p. 2974, Nov. 1981.
IBM Technical Disclosure Bulletin, Miller et al., vol. 24, No. 12, pp. 6430, 6431, May 1982.
Patent Abstracts of Japan, vol. 12, No. 201 (M-707)[3048], Jun. 10, 1988; corresponds to JP-A-63 5895.
Patent Abstracts of Japan, vol. 11, No. 281 (M-624)[2728], Sep. 11, 1987; corresponds to JP-A-62 81290.
Magazine of "Electronics", Metal-Ceramic Brazed Seals; R. J. Bondley; pp. 97-99, Jul. 1947.

Primary Examiner—Nicholas P. Godici
Assistant Examiner—Samuel M. Heinrich
Attorney, Agent, or Firm—Oblon, Spivak, McClelland, Maier & Neustadt

[57] ABSTRACT

According to the present invention, there is provided an electronic component part comprising (i) a high thermal conductivity ceramic circuit board, (ii) terminal pins located over said circuit board, and (iii) a metal brazing material having metal brazing powder, at least one element selected from the Group IVa elements and a metal having a melting point higher than that of the metal brazing powder, the metal brazing material bonding said board and said pins. According to the present invention, metal, such as input/output terminal pins can very firmly be bonded to ceramic, such as a circuit board, within an atmosphere of, for example, N$_2$ gas without the scattering of any brazing material in which case, unlike the prior art method, vacuum furnace is not employed.

9 Claims, 1 Drawing Sheet

BRAZING PASTE FOR BONDING METAL AND CERAMIC

BACKGROUND OF THE INVENTION

1. Field of the Invention

The present invention relates to a brazing paste for use in bonding together metal and ceramic. The U.S. application Ser. No. 154,273 filed on Feb. 10, 1988 relates to the present application.

2. Description of the Related Art

A circuit board with a semiconductor device mounted thereon includes, for example, a resin board, metal board or ceramic board. Of these boards, the ceramic board has extensively been used in terms of its excellent heat radiation characteristic, electrical characteristic and overall reliability over those of the other boards. In view of a recent development of ceramics excellent in heat conduction characteristic and heat radiation characteristic, there is a growing demand for ceramic boards.

When metal and ceramic are bonded together, for example, input/output terminal pins are joined to the ceramic circuit board, pin joining spots on the ceramic circuit board are plated with Ni in the prior art technique to provide pads of high wettability to a metal brazing material and then the terminal pin is brazed or soldered to the pad. However, this method requires a wider pad area for enhancing a strength of bond to the pin, making it difficult to make a bond of the terminal pin to the pad in high density. Some of the ceramic for use for the board reveal a poor wettability to a brazing or soldering melt, failing to make a firm bond to the terminal pin.

In view of the above situations a new method has been developed in which the terminal pin is joined to the ceramic circuit board in a vacuum furnace with the use of an active metal brazing material containing Ti, Zr, etc. However, this method cannot attain a high-quantity production for a practical use.

In order to circumvent the disadvantage involved in the aforementioned method using the vacuum furnace a method has been conceived which employs an active metal-added paste under an $N_2$ atmosphere. If use is made of such a paste, it is scattered around upon being heated, degassed and cured, causing a degradation in a bond surface uniformity and hence in an outer appearance. A poor electrical characteristic, i.e. a drop in insulation resistance sometimes occurs in the body.

SUMMARY OF THE INVENTION

According to the present invention, there is provided an electronic component part comprising: (i) a high thermal conductivity ceramic circuit board; (ii) terminal pins located over said circuit board; and (iii) a metal brazing material having metal brazing powder, at least one element selected from the Group IVa elements and a metal having a melting point higher than that of the metal brazing powder, the metal brazing material bonding said board and said pins.

According to another aspect of the present invention a brazing paste for bonding metal and ceramic, comprising: metal brazing powder containing: (i) at least one element selected from the Group IVa elements; and (ii) a metal having a melting point higher than that of the metal brazing powder.

DETAILED DESCRIPTION OF THE PREFERRED EMBODIMENTS

Figure 1A:
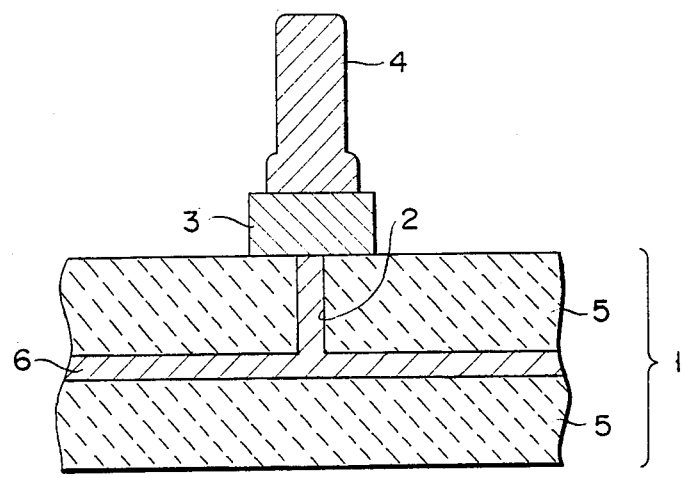
FIGS. 1A and 1B are cross-sectional views showing the steps of manufacturing a ceramic package using a paste of the present invention.

According to the present invention, metal, such as input/output terminal pins can very firmly be bonded to ceramic, such as a circuit board, within an atmosphere of, for example, $N_2$ gas without the scattering of any brazing material in which case, unlike the prior art method, any vacuum furnace is not employed.

In the present invention, a Cu brazing, Ni brazing, Ag brazing material etc. are employed as a metal brazing material to make a bond between the metal and the ceramic, but it is desirable to use an Ag brazing, Cu brazing or a brazing material containing Ag and Cu as principal components in view of the fact that a bond can be effected at low temperature and that better wettability is achieved between the ceramic and the metal.

In the present invention, the Group IVa elements contained in the metal brazing material are, for example, Ti, Zr and Hf, but it is desirable to use Ti or Zr because these elements reveal a high active function upon heating. The wettability of the brazing material to the ceramic is increased due to the action of Ti or Zr and the content of the Group IVa element in the metal brazing material is desirably 2 to 10% by weight. This is because the wettability of the brazing material to the ceramic is poor for less than 2% by weight of the element in which case the brazing material is coagulated on the ceramic so that the metal cannot intimately be bonded to the ceramic. If, on the other hand, the content of the element exceeds 10% by weight, an electrical resistance of a bonded area is increased, and the bondability between the metal and the brazing material becomes lower.

In view of the fact that the melting point of the brazing material is 800° to 850° C., the melting point of the metal which is higher than that of the brazing material exceeds that temperature range. The aforementioned element (metal) is added to the metal brazing material for the reason as will be set forth below. For example, when the brazing material and binder are kneaded into a paste, it is melted by heating so that the metal is bonded to the ceramic at which time the binder is evaporated while, on the other hand, the metal is not melted due to its melting point higher than that of the brazing material so that the metal is uniformly mixed with the brazing material. As a result, the brazing material is prevented from being scattered around. As such metal, use is made of Mn, W, Mo, Ta, etc. It is preferable that the content of the metal of which melting point is higher than that of the brazing material be 2 to 50% by weight. The reason for this is as will be set forth below. For less than 2% by weight of the brazing material the aforementioned effect cannot be obtained and the brazing material is scattered around. For the content of the brazing material exceeding 50% by weight, the melting point of the brazing material is raised to an excess extent and the bond surface becomes uneven due to the presence of metal particles unmelted after heating has been effected. An electrical resistance of the bonded area is also increased.

A powdered brazing material, if being kneaded with an organic binder, provides a brazing paste readily applicable to a bonding step. As such organic binder, because it is difficult to scatter around within a nitrogen gas, use is made of preferably an acrylic binder, especially a polyacrylic acid ester and polymethacrylic acid ester containing a carboxylic group as a substituent because they reveal a better dispersion within the paste, or a polyacrylic acid ester and polymethacrylic acid ester partially polymerized with styrene. The content of the carboxylic group which is introduced as the substituent into the acrylic binder is preferably 1 to 5% by weight. The reason is that for less than 1% by weight the powdered metal brazing material is coagulated and degraded in its bondability to the ceramic and for the content greater than 5% by weight the binder becomes unstable and readily gelled so that a paste is difficult to form. The molecular weight of the acrylic binder is preferably 5000 to 15000. For less than 5000, the binder is readily volatilized, lowering the bondability to be attained by the paste. For the molecular weight exceeding 15000, more carbon remains on the bond surface after the heating has been performed, thus involving a risk that a bond of the metal to the ceramic will be lowered.

It is desired that an amount of acrylic binder added to the powdered brazing material be 3 to 15 parts by weight against 100 parts by weight of the powdered brazing material. The reason is that for less than 3 parts by weight it is difficult to obtain a paste due to the viscosity lowered and for the amount exceeding 15 parts by weight more carbon is liable to remain upon heating the brazing material at a bonding step so that a bond strength is reduced. An amount of acrylic binder added to the brazing material is preferably 5 to 10 parts by weight against 100 parts by weight of the powdered metal brazing material.

To the paste of the present invention an organic agent is applied to increase its flow-out. Such an agent is, for example, terpionel, diethyleneglycol and mono-n-butyl ether. The solvent is volatilized prior to the heating of the paste.

The bonding of the metal to the ceramic by the brazing paste will be explained below.

A brazing material paste comprising a powdered metal brazing material containing at least one kind of the Group IVa, acrylic binder containing a carboxylic group as a substituent and organic solvent is coated on a bond area of ceramic by a screen printing, potting and so on, to form a paste layer of a desired configuration. Then a metal is placed on the paste layer and this unit is heated within an atmosphere containing nitrogen as a principal element to bond the metal to the ceramic.

As a ceramic board for an electronic component of the present invention use is made of one made of ceramic only, one formed of a ceramic board with a conductive layer formed on the surface thereof, or one formed of a ceramic board with a conductive layer formed on the surface and in the interior thereof, some of which is of a type with the inner conductive layers connected to each other and some of which is of a type with the surface conductor and inner conductor connected via a throughhole. The material for the ceramic board is one with, for example, $Al_2O_3$ as a principal component, ceramic sinterable at a low temperature, such as glass ceramic, $BaSn(BO_3)$, lead borosilicate glass or zinc borosilicate glass, or one having a high thermal conductivity, such as aluminum nitride and silicon carbide. As aluminum nitride use can be made of a sintered body formed of aluminum nitride alone or a sintered body containing the rare earth element such as Y or alkaline-earth element such as Ca as a sinter assistant.

As the metal to be bonded to the ceramic by the brazing paste of the present invention the input/output terminal pins can be listed for instance.

In the present invention, the brazing material is heated under an atmosphere containing a nitrogen gas as a principal component, noting that as the atmosphere use may be made of an atmosphere of a nitrogen gas alone or a nitrogen gas atmosphere containing oxygen of 20 ppm. Such an atmosphere can be achieved, for example, within a tunnel. Under such atmosphere the metal is bonded by the brazing paste to the ceramic under a specific temperature, a temperature higher than the melting point of the metal brazing material in the brazing material paste but lower than the melting point of the metal higher than that of the brazing material.

Using the brazing paste of the present invention, the metal such as the input/output terminal pin is bonded to the ceramic such as the ceramic circuit board by heating under an atmosphere containing the nitrogen has as a principal component so that it is possible to form a metal/ceramic bond of high density and high strength. By forming into a paste a brazing material containing the Group IVa element and metal higher in melting point than the brazing material, it is possible to adopt a coating method such as a printing method and to accurately form a brazing paste bond layer on the bond area of the ceramic in high density in comparison with the case where use is made of a metal brazing material alone. Furthermore, upon heating within an atmosphere containing a nitrogen gas as a principal component the metal brazing material in the brazing paste is melted to allow the metal brazing material to be better wetted to the ceramic board due to an action of the activated Group IVa element in the melt thereon so that it is possible to effect a bond of high strength. By the metal higher in melting point than the brazing material the degassing of the paste is effected without the brazing paste being scattered around so that there is no decline in electrical insulation. Furthermore, an acrylic binder in the paste is readily broken down by a heat within the aforementioned atmosphere, preventing the remaining of carbon which would otherwise act as a bar to the wettability of a bond face. According to the present invention the input/output terminal pin is bonded to, for example, the ceramic circuit board in a reliable way in comparison with the conventional technique using a vacuum furnace in the formation of a bond. It is thus possible to more simply and reliably manufacture ceramic packages where the input/output terminal pin is bonded to the ceramic circuit board.

EXAMPLE 1

An embodiment of the present invention will be explained below with reference to FIGS. 1A and 1B.

First, Mn was used as metal higher in melting point than a brazing material. To 100 parts by weight of a powdered metal brazing material consisting of respectively 1, 3, 5, 10, 40 and 55% by weight of Mn, 5% by weight of Ti and a balance of Ag or Cu, 5 parts by weight of an acrylic resin containing 3% by weight of a COOH group as a substituent (acrylic acid ester polymer: a molecular weight of 10,000) was added and after a resultant mix was dissolved with terpionel it was kneaded by a mortar for 1 hour to prepare 6 kinds of brazing pastes of a varying Mn content.

Figure 1B:
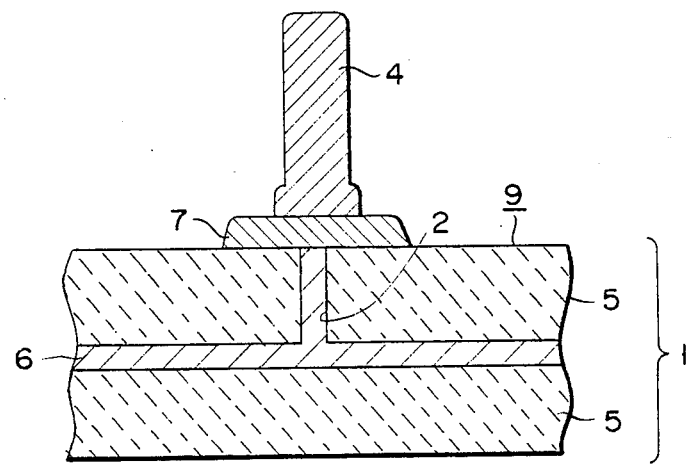

Then an AlN ceramic 5-made multi-layered circuit board 1 was prepared having a tungsten conductive layer 6 therein as shown in FIG. 1A. A 200 μm-thick stainless screen (not shown) with a 1 mm-dia. printing portion punched was placed on the circuit board at a pin mount location where a tungsten-filled throughhole 2 was formed. The paste was flowed onto the screen and screen-printed on the pin mount location. Then the unit was dried for 10 minutes at 120° C. to allow the terpionel to evaporate so that a brazing material paste layer 3 was formed. A 42% Ni-Fe-made input/output terminal 4 was butted against the brazing paste layer 3 by means of a carbon jig and held there against any positional displacement. This unit was sent into a belt type tunnel furnace, not shown, with the terminal pin 4 held by the carbon jig and heated within the tunnel furnace for 10 minutes at 830° C. within a nitrogen gas atmosphere with an oxygen concentration of 16 ppm to bond the terminal pin 4 to the circuit board 1 via a metal brazing material layer 7 as shown in FIG. 1B. In this way, 6 kinds of ceramic packages 9 were manufactured.

Of these ceramic packages thus obtained, the package with 1% by weight of Mn in the paste involved the scattering of the paste and was not good in its external appearance. The package with 55% by weight of Mn in the paste was uneven on its surface after having been heated and poor in its outer appearance. These packages with 2 to 40% by weight of Mn in the paste revealed a better wettability of the pin to the circuit board. Upon measuring a pin/board bond strength by a tension tester of Instron Corp., a value was 10 Kgf/pin on the average and 6 Kgf/pin at minimum, each value of which is very strong, confirming that a bond shows a small variation in bond strength. Upon measuring a value of a resistance across the pin 4 and the tungsten conductive layer 6 by a conduction test, an increase of the resistance was small, that is, below 50 mΩ, in comparison with a conventional case where a nickel plating was effected over a tungsten conductive layer over a tungsten-filled throughhole and the terminal pin was bonded to the board by an Ag brazing material. It has also been confirmed that all the pins were electrically conducted well to a conductive portion of the through hole.

EXAMPLE 2

An experiments was conducted using a paste containing W powder. In this case, the same method as in Example 1 was employed with the use of the same contents of Ti, metal brazing material and binder in a paste as those of Example 1, except that the contents of W were 1, 3, 8, 10, 30 and 60% by weight. In this way, 6 kinds of pastes were prepared and hence 6 kinds of ceramic packages were manufactured, as in the same way as in Example 1, with an input/output terminal pin attached to an AlN substrate. In those ceramic packages thus obtained, a package with a bond made using a paste containing 1% by weight of W involved the scattering of the brazing material and revealed a poor outer appearance. A package with a bond effected using 60% by weight of W revealed a decline in a wettability of the brazing material to AlN and a low bond strength of 1 Kgf/pin. On the other hand, those packages with a bond made with the use of pastes of 3, 8, 10 and 30% by weight are excellent in wettability of the pin to the circuit board and very strong, that is, 5.5 Kgf/pin at minimum, in bond strength upon measurement. It has also been found that there is less variation in strength among the packages of the present application.

What is claimed is:

1. An electronic component part, comprising:
   (i) a high thermal conductivity ceramic circuit board;
   (ii) terminal pins located over said circuit board; and
   (iii) a metal brazing material layer bonding said board and said pins and comprised of a brazing metallic material and at least one element selected from the group consisting of Group IVa elements, said brazing material layer having metal particles having a melting point higher than that of said brazing metallic material mixed therein.

2. The electronic component part of claim 1, wherein said thermal conductivity ceramic circuit board has as a component thereof an insulating layer comprised of an aluminum nitride sintered body.

3. The electronic component part of claim 1, wherein said circuit board has recesses at locations at which terminal pins are bonded to the circuit board.

4. The electronic component part of claim 1, wherein said metal brazing material is comprised of an alloy containing Ag and/or Cu as a principal element and 2–15% by weight of Ti, Zr or combinations thereof.

5. The electronic component part of claim 1, wherein said brazing material is comprised of Ag and/or Cu as a principal element and 2–10% by weight of Ti, Zr or combinations thereof.

6. The electronic component part of claim 1, wherein said brazing material is comprised of Ag as a principal element and 2–10% by weight of Ti or Zr.

7. The electronic component part of claim 1, wherein said metal particles are made of Mn or W.

8. The electronic component part of claim 1, wherein the content of said metal particles ranges from 2–50 wt. %.

9. The electronic component part of claim 1, wherein said metal brazing material layer comprises 2–10% by weight of said at least one Group IVa element and 2–50% by weight of said metal particles.

* * * * *